United States Patent
Nam et al.

(10) Patent No.: US 9,524,759 B2
(45) Date of Patent: Dec. 20, 2016

(54) APPARATUSES AND METHODS FOR CAPTURING DATA USING A DIVIDED CLOCK

(71) Applicant: Micron Technology, Inc., Boise, ID (US)

(72) Inventors: Ki-Jun Nam, Boise, ID (US); John David Porter, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 136 days.

(21) Appl. No.: 14/571,735

(22) Filed: Dec. 16, 2014

(65) Prior Publication Data

US 2016/0172018 A1 Jun. 16, 2016

(51) Int. Cl.

| | |
|---|---|
| G06F 1/04 | (2006.01) |
| G06F 1/12 | (2006.01) |
| G06F 5/06 | (2006.01) |
| G11C 7/10 | (2006.01) |
| H03K 5/15 | (2006.01) |
| G11C 7/22 | (2006.01) |
| H03K 3/017 | (2006.01) |
| G11C 7/00 | (2006.01) |

(Continued)

(52) U.S. Cl.
CPC .......... G11C 7/1012 (2013.01); G11C 7/1087 (2013.01); G11C 7/1093 (2013.01); H03K 5/1502 (2013.01); G11C 7/00 (2013.01); G11C 7/10 (2013.01); G11C 7/106 (2013.01); G11C 7/22 (2013.01); G11C 7/222 (2013.01); G11C 8/00 (2013.01); G11C 8/18 (2013.01); G11C 2207/107 (2013.01); H03K 3/017 (2013.01); H03L 7/06 (2013.01)

(58) Field of Classification Search
CPC ............ G11C 7/10; G11C 7/222; G11C 7/00; G11C 7/22; G11C 7/106; G11C 8/18; G11C 8/00; H03L 7/06; H03K 3/017
See application file for complete search history.

(56) References Cited

U.S. PATENT DOCUMENTS 6,801,989 B2 10/2004 Johnson et al.
7,787,310 B2 8/2010 Johnson (Continued)

OTHER PUBLICATIONS

International Search and Written Opinion received for PCT/US2015/058832 dated Feb. 17, 2016.

*Primary Examiner* — Xuxing Chen
(74) *Attorney, Agent, or Firm* — Dorsey & Whitney LLP

(57) ABSTRACT

Apparatuses and methods for capturing data using a divided clock are described. An example apparatus includes a clock divider configured to receive a DQS signal, and to provide divided clock signals. A divided clock signal of the divided clock signals has a frequency that is less than a frequency of the DQS signal. The example apparatus further includes a command circuit configured to receive a command, and to assert one of a plurality of flag signals based on the divided clock signals and on a defined latency from a time of receipt of the command. The example apparatus further includes a data capture circuit configured serially receive data associated with the command and to provide deserialized data responsive to the divided clock signals. The data capture circuit is further configured to sort the deserialized data based on the asserted one of the plurality of flag signals to provide sorted data.

23 Claims, 6 Drawing Sheets

(51) Int. Cl.
    *G11C 8/00*     (2006.01)
    *H03L 7/06*     (2006.01)
    *G11C 8/18*     (2006.01)

(56) References Cited

U.S. PATENT DOCUMENTS

| | | |
|---|---|---|
| 8,023,343 B2 | 9/2011 | Bringivijayaraghavan et al. |
| 2006/0215466 A1 | 9/2006 | Tseng |
| 2008/0126822 A1 | 5/2008 | Kim et al. |
| 2008/0165611 A1 | 7/2008 | Fujisawa et al. |
| 2009/0115480 A1 | 5/2009 | Jang et al. |
| 2009/0213663 A1* | 8/2009 | Johnson ............... G11C 7/1006 365/189.02 |
| 2012/0230144 A1 | 9/2012 | Nagata |

* cited by examiner

APPARATUSES AND METHODS FOR CAPTURING DATA USING A DIVIDED CLOCK

BACKGROUND OF THE DISCLOSURE

In semiconductor memory, proper operation of the memory is based on the correct timing of various internal command and clock signals. For example, in writing data to the memory, internal clock signals that clock data block circuitry to provide input to the write command may need to be provided substantially concurrently with receipt of write data at input circuitry in order for the data block circuitry to properly capture the write data. If the timing of the internal write command signal is not such that the data block circuitry is enabled at the time the data strobe (DQS) signal clocks the data block circuitry to capture the write data at an expected time, incorrect or incomplete write data may be inadvertently captured and written to the memory.

Moreover, as known, a "latency" may be programmed to set a time, typically in numbers of clock periods (tCK), between receipt of a write command by the memory and receipt of the write data at the memory. The latency may be programmed by a user of the memory to accommodate clock signals of different frequencies (i.e., different clock periods). Other examples of commands that may require the correct timing of internal clock signals and the command for proper operation include, for example, read commands and on-die termination enable commands.

Complicating the provision of correctly timed internal clock and command signals is the relatively high frequency of clock signals. For example, clock signals can exceed 1 GHz. Further complicating the matter is that multi-data rate memories may receive data at a rate higher than the clock signal. The timing domains of command and clock signals may need to be crossed in order to maintain proper timing. An example of a multi-data rate memory is one that receives write data at a rate twice that of the clock frequency, such as receiving data synchronized with each of the clock edges of the DQS signal.

In some examples, a data strobe signal DQS may be used to time receipt of data, and the timing of the command may be received according to timing of an external clock signal. A memory controller may initiate the DQS signal for a minimum number of clock cycles prior to the receipt of the data (e.g., a preamble) to allow, for example, the circuitry of the semiconductor memory to stabilize. However, the length of the preamble may vary, so the DQS signal is not a reliable source for determining when the first data bit is to arrive.

Additionally, the timing of the DQS signal could be aligned to the external clock rise/fall edges or it could lag/lead the clock-edges by a certain percentage of an external clock signal clock cycle (e.g., tDQSSmin/max variation). For example, in DDR3 architectures, tDQSSmin/max variation may be up to 25% of tCK. Thus, the range of variation of the DQS signal is 0.5*tCK wide from 0.25*tCK earlier than the external clock to 0.25*tCK later than the external clock, adding a further complication to achieving proper timing.

An example conventional approach of timing internal command to enable capture of data via the DQS signal is delaying the write command through delays such that the DQS signal and the write command have the same propagation delay to the input circuitry. However, the propagation delay of the various internal propagation paths can often vary due to process, voltage, and temperature conditions. For DQS and command paths having relatively long propagation delay or additional delay circuitry, the variations due to operating conditions may negatively affect the timing of the internal signals to such a degree that the memory does not operate properly. Additionally, increasing a clock frequency enhances the negatively affected timing, as a margin for error becomes smaller.

DETAILED DESCRIPTION

Certain details are set forth below to provide a sufficient understanding of embodiments of the disclosure. However, it will be clear to one skilled in the art that embodiments of the disclosure may be practiced without these particular details. Moreover, the particular embodiments of the present disclosure described herein are provided by way of example and should not be used to limit the scope of the disclosure to these particular embodiments. In other instances, well-known circuits, control signals, timing protocols, and software operations have not been shown in detail in order to avoid unnecessarily obscuring the disclosure.

Figure 1:
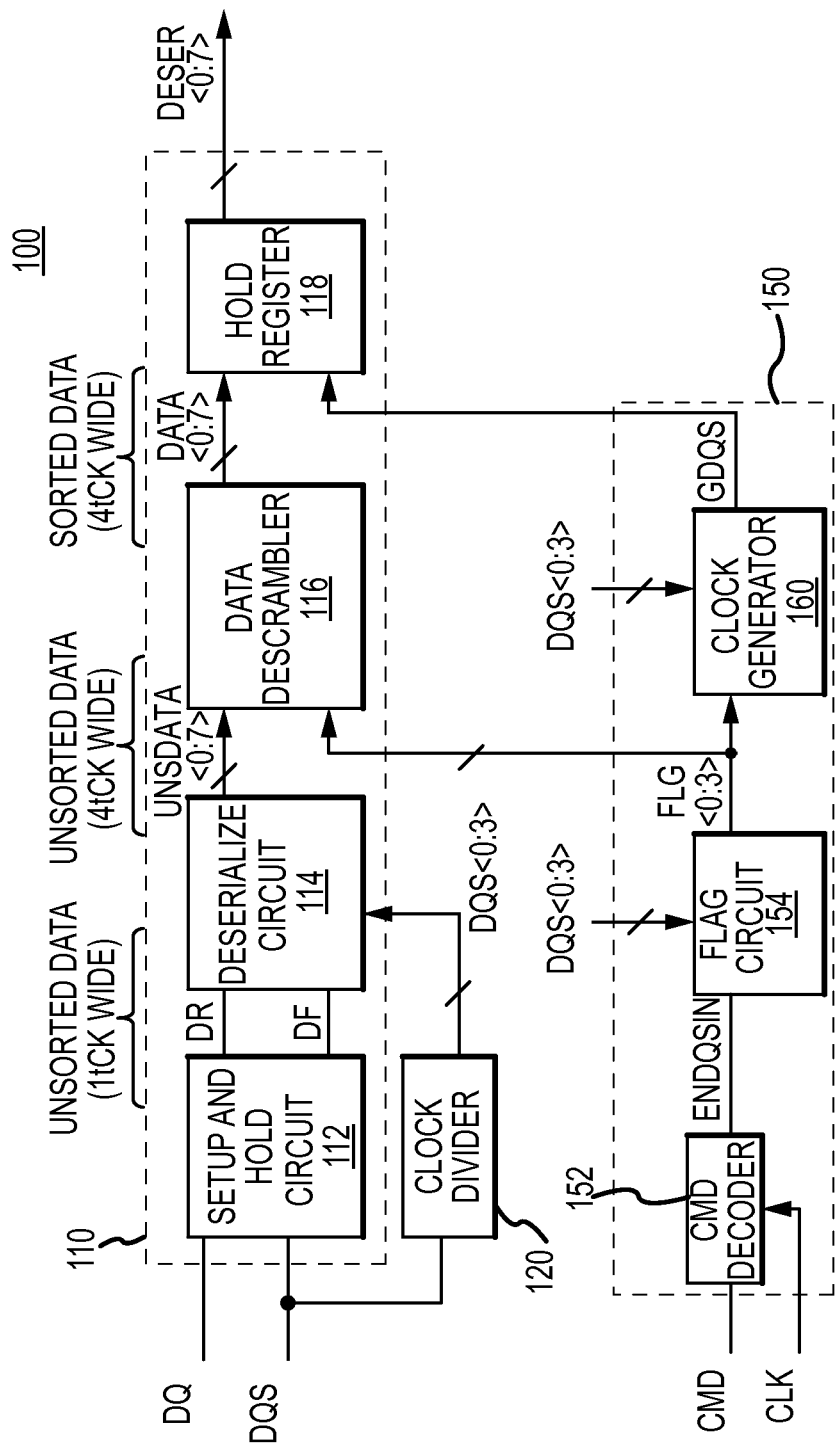
FIG. 1 is a simplified block diagram of an apparatus according to an embodiment of the disclosure.

FIG. 1 illustrates an apparatus 100 (e.g., an integrated circuit, a memory device, a memory system, an electronic device or system, a smart phone, a tablet, a computer, a server, etc.) according to an embodiment of the disclosure. The apparatus may include a data capture circuit 110 and a command circuit 150. The command circuit 150 may receive a command signal CMD and a clock signal CLK. The data capture circuit 110 may receive data via a DQ that may correspond to a command received via the CMD signal. The data capture circuit 110 may also receive a data strobe signal DQS that may be used to clock the received data. The apparatus may further include a clock divider 120 configured to provide divided DQS signals DQS<0:3> to the data capture circuit 110 and the command circuit 150. The command circuit 150 may provide flag signals FLG<0:3> to the data capture circuit 110 having values based on the DQS<0:3> signals and timing of receipt of the command via the CMD signal. The data capture circuit 110 may include circuitry configured to capture the data based on the divided clock signals DQS<0:3>, and may determine an order of (e.g., descramble) the data based on FLG<0:3> signals.

The clock divider 120 may divide the frequency of the DQS signal to provide the DQS<0:3> signals. The divided DQS signal may be divided by an integer multiple, such as four. In some examples, the integer multiple may be based on a count of the DQS<0:3> signals to be generated. For the sake of clarity, the following discussion will be based on the integer multiple being four. The clock divider 120 may provide the DQS<0:3> signals having a period equal to 4 tCK of the DQS signal. Each of the DQS<0:3> signals may include a 1 tCK wide pulse during each period, with the pulses of each of the DQS<0:3> signals staggered such that each has a different (e.g., unique phase). In some examples, the clock divider 120 may generate separate rising and falling DQS<0:3> signals (e.g., DQSR<0:3> signals and DQSF<0:3> signals).

The data capture circuit 110 may include a setup and hold circuit 112 configured to capture the data via the DQ based on the DQS signal. The setup and hold circuit 112 may pass the captured data to a deserialize circuit 114 of the data capture circuit 110. The data may be separated into rising edge data DR (e.g., data captured coincident with a rising edge of the DQS) and falling edge data DF (e.g., data captured coincident with a falling edge of the DQS).

The deserialize circuit 114 may receive the DQS<0:3> signals, and may include a plurality of registers configured to provide unsorted data UNSDATA<0:7> at respective outputs responsive to the DQS<0:3> signals. Each register of the plurality of registers may be controlled by an individual signal of the DQS<0:3> signals. Due to variance in a length of the preamble of the DQS signal, an order of the bits within the UNSDATA<0:7> may be different than an order of the bits received via the DQ.

The data capture circuit 110 may further include a data descrambler 116 and a hold register 118. The data descrambler 116 may sort the UNSDATA<0:7> bits from the deserialize circuit 114 to provide sorted data DATA<0:7> to the hold register 118. The sorted DATA<0:7> may provide the data in an order in which the data is received at the DQ. The data descrambler 116 may determine the DATA<0:7> order based on the FLG<0:3> signals received from the clock generator 160. The hold register 118 may latch the DATA<0:7> to provide DSER<0:7> data at an output responsive to a global DQS signal.

The command circuit 150 may include a command decoder 152 configured to decode the command received via the CMD. The command may be received based on timing of the CLK signal. The command decoder 152 may provide an ENDQSIN signal having a pulse that is indicative of timing of receipt of data at the DQ. The delay between receiving the command via the CMD signal and provision of the ENDQSIN signal at an output may be determined based on a defined latency based on a number of tCK of the CLK signal, such as a column address strobe (CAS) write latency (CWL).

The command circuit 150 may further include a flag circuit 154 that is configured to provide the FLG<0:3> signals having values based on the ENDQSIN signal and the DQS<0:3> signals. The FLG<0:3> signals may indicate a location of the first bit of data received at the DQ within the UNSDATA<0:7> data. The command circuit 150 may further include a clock generator 160 configured to generate the GDQS signal based on the FLG<0:3> signals and the DQS<0:3> signals.

In operation, the apparatus 100 may receive a command via the CMD signal, a DQS signal, and data via the DQ, that are each associated with a memory access operation. The command, DQS signal, and data may each be provided, for example, by a memory controller (not shown). In some embodiments, the command may be a write command. In some memory systems, a defined latency between the command and the first bit of the data, such as the CWL, may be implemented to allow some time for the apparatus 100 to process the command and prepare circuitry of the apparatus 100 for capturing data prior to receiving the data. The command may be received via the CMD signal according to timing of the CLK signal (e.g., a system clock), and the data may be received according to timing of the DQS signal. In some embodiments, timing of the DQS signal and timing of the CLK signal may be offset from (e.g., lead or lag) each other by up to ¼ of a tCK. Further, provision of the DQS signal may generally coincide with transmission of data, and may be disabled (e.g., to conserve power) when data ceases to be transmitted. The DQS signal may be started a minimum tCK prior to the first bit of data arriving (e.g., a preamble), such as 1.5 tCK, to allow circuitry of the apparatus 100 to initialize. In some examples, preamble of the DQS signal may longer than the minimum, such as 2 tCK or greater. Thus, the variance in length of the preamble may limit an ability of the apparatus 100 to determine which DQS signal edge coincides with the first data bit of data based only on evaluation of the DQS signal. The apparatus 100 may be reliant on use of the CWL to determine timing of receipt of data corresponding to a received command via the CLK and CMD signals. The apparatus 100 may determine a DQS signal edge corresponding to the first bit of the data based on the CWL.

The command decoder 152 may decode the CMD signal to determine a command type. When the command is a write command, the command decoder 152 may provide a pulse on the ENDQSIN signal after a defined latency. The defined latency may be based on the CWL. In some examples, the pulse on the ENDQSIN signal may be 1 tCK wide. In some examples, the pulse on the ENDQSIN signal may start at the time the first bit of data is to be received at the DQ (e.g., CWL).

The setup and hold circuit 112 and the clock divider 120 may receive DQS signal having a preamble of at least 1.5 tCK before the first bit of data is received via the DQ. The clock divider 120 may divide the frequency of the DQS signal by four. The clock divider 120 may generate the DQS<0:3> signals based on the divided DQS signal. Each of the DQS<0:3> signals may have a 4 tCK period with a 1 tCK wide pulse during each respective period. The pulses (e.g., and period start/end times) of the DQS<0:3> signals may be staggered so that each DQS<0:3> signal has a unique phase. The setup and hold circuit 112 may receive and hold the data received via the DQ based on rising and falling edges of the DQS without regard to whether the data corresponds to a particular command. The setup and hold circuit 112 may provide, to the deserialize circuit 114, data captured on the rising edge of the DQS signal via the DR signal and data captured on the falling edge of the DQS signal via the DF signal. Each bit of data provided by the DR and DF signals may be 1 tCK wide. In some examples, bits of data are provided from the DR and DF signal in parallel. For example, bit 0 may be captured on a first rising edge and bit 1 captured on a first falling edge may be provided on the DR and DF signals, respectively, in parallel.

The deserialize circuit 114 may include registers that are each clocked according to a respective DQS<0:3> signal. In some embodiments, a count of registers may be equal to two times a count of DQS<0:3> signals, with half coupled to the DR signal and half coupled to the DF signal. Thus, the registers may operate in serial fashion starting with a first set of registers clocked by the DQS<0> signal, a second pair of registers clocked by the DQS<1> signal, etc. The registers may propagate a value of the respective DR or DF signals to an output responsive to the corresponding DQS<0:3> signal to provide the UNSDATA<0:7>.

As previously discussed, the preamble of the DQS signal may vary in length. Thus, the first bit of data captured at the registers of the deserialize circuit 114 may be held by a register other than the first register (e.g., the first bit of data received at the DQ may be in any location of the UNSDATA<0:7>). Thus, while data is being held by registers of the deserialize circuit 114, the flag circuit 154 may assert one of the FLG<0:3> signals based on the pulse of the ENDQSIN signal and the respective DQS<0:3> signal. The asserted FLG<0:3> signal may indicate a location of the first bit of data within the UNSDATA<0:7>. For example, the flag circuit 154 may assert the FLG<0:3> signal that corresponds to the DQS<0-3> signal having a rising edge occurring during the pulse of the ENDQSIN signal. The asserted FLG<0:3> signal may be provided to the data descrambler 116.

The data descrambler 116 may include circuitry that sorts the UNSDATA<0:7> based on the asserted FLG<0:3> signal to provide the sorted data DATA<0:7>. The sorted DATA<0:7> may be provided to the hold register 118. The order of the sorted DATA<0:7> may match the order of the data received at the DQ. In some examples, the data descrambler 116 may include multiplexers that route the UNSDATA<0:7> based on the asserted FLG<0:3> signal to provide the DATA<0:7>.

The hold register 118 may include latches configured to latch the sorted DATA<0:7>. The set of registers of the hold register 118 may be clocked by the GDQS signal. The clock generator 160 may generate the GDQS signal based on the asserted FLG<0:3> signal and the DQS<0:3> signals. Because the asserted FLG<0:3> is indicative an order of the sorted DATA<0:7> based on the DQS<0:3> signals, the DQS<0:3> signal that corresponds to the last bit of the sorted DATA<0:7> may also be determined. Thus, the clock generator 160 may provide a 1 tCK pulse on the GDQS signal that is based on the DQS<0:3> signal associated with last bit of data. Responsive to the pulse on the GDQS signal, the latches of the hold register 118 may latch respective bit of the sorted DATA<0:7> at an output to provide the DESER<0:7> data.

Often, the CLK and CMD signals may be received at a different location on the apparatus than the DQ and DQS signals, which may result in different propagation paths through the apparatus 100. Because the CLK and DQS signals may operate at relatively high frequencies, propagation delay differences between signals may negatively impact an ability to reliably and accurately capture data. The relative timing of the ENDQSIN and DQS<0:3> signals is critical to ensure the correct data is captured. Thus, the propagation path of the ENDQSIN and DQS<0:3> signals may be designed such that the respective paths are approximately the same length and width to provide minimal differences in propagation delay.

It would be appreciated that the description of the apparatus 100 may include more or less DQS<0:3> signals, FLG<0:3> signals, latches in the deserialize circuit 114, etc. For example, a count of DQS<0:3> signals may be based on a count of bits per DQ associated with the write command. In the example described, the write command may be associated with eight bits per DQ. In other examples, a write command may be associated with 16 or more bits, resulting in more than four DQS<0:X> signals. Further, the period of each of the DQS<0:3> signals generated by the clock divider 120 may be based on the number of DQS<0:X> signals. For example, the period may be equal to 1 tCK multiplied by a count of the DQS<0:X> signals.

Figure 2:
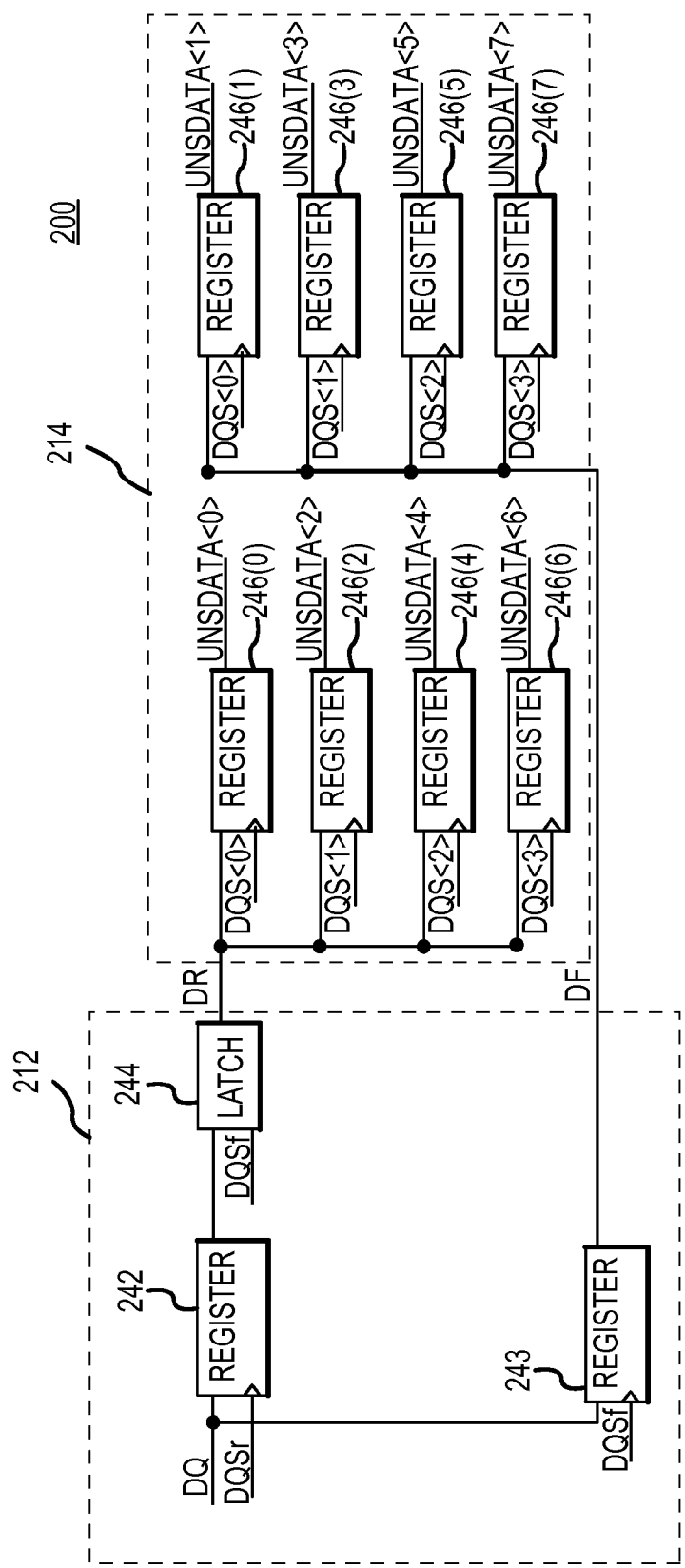
FIG. 2 is a block diagram of an apparatus including a setup and hold circuit coupled to a deserialize circuit according to an embodiment of the disclosure.

FIG. 2 is a block diagram of an apparatus 200 including a setup and hold circuit 212 coupled to a deserialize circuit 214 according to an embodiment of the disclosure. The setup and hold circuit 212 may be implemented in the setup and hold circuit 112 of FIG. 1 and/or the deserialize circuit 214 may be implemented in the deserialize circuit 114 of FIG. 1.

The setup and hold circuit 212 may receive data via the DQ and may capture the rising edge data at a register 242 responsive to a rising edge of the DQS signal DQSR and may capture falling edge data at a register 243 responsive to a falling edge of the DQS signal DQSF. The setup and hold circuit 212 may provide the rising edge data to the deserialize circuit 214 via the DR signal and may provide the falling edge data to the deserialize circuit 214 via the DF signal. The setup and hold circuit 212 may include a latch 244 that is coupled to the output of the register 242. The latch 244 may delay the rising edge data ½ tCK such that rising edge data and falling edge data are provided to the deserialize circuit 214 in parallel.

The deserialize circuit 214 may include a set of rising edge data registers 246(0, 2, 4, 6) and a set of falling edge data registers 246(1, 3, 5, 7). Each of the data registers 246(0-7) may be controlled by a respective DQS<0:3> signal, such as the DQS<0:3> signals of FIG. 1.

In operation, the register 242 may receive data via the DQ and may provide the received data at an output responsive to the DQSR signal (e.g., rising edge of the DQS signal). The latch 244 may receive data provided at the output of the register 242 and may provide the data to the deserialize circuit 214 via the DR signal. The register 243 may receive the data via the DQ and, responsive to the DQSF signal (e.g., falling edge of the DQS signal), may provide the data to the deserialize circuit 214 via the DF signal. Thus, each bit of data is held on the DR and DF signal for 1 tCK.

The deserialize circuit 214 may receive the DR and DF signals. The data registers 246(0-7) may provide the data received via the DR and DF signals to a respective output as the UNSDATA<0:7> data responsive to a respective DQS<0:3> signal. As previously described, each DQS<0:3> may have a period of 4 tCK and have a unique phase. Thus, if the pulses of the DQS<0:3> signals occur consecutively from DQS<0> to DQS<3>, the rising edge data registers 246(0, 2, 4, 6) may operate sequentially from register 246(0) to register 246(6), before wrapping around to register 246(0), again. Similarly, the falling edge data registers 246(1, 3, 5, 7) may operate sequentially from register 246(1) to register 246(7), before wrapping around to register 246(1), again. As each bit of data provided by the DR signal is 1 tCK wide, one of the registers 246(0, 2, 4, 6) may capture the data received via the DR signal at an output responsive to the respective DQS<0:3> signal. Further, one of the registers 246(1, 3, 5, 7) may capture the data received via the DF signal at an output responsive to the respective DQS<0:3> signal. The capturing of data by the register 246(0-7) may continue to occur in a parallel, round-robin fashion responsive to the DQS<0:3> signals (e.g., as long as the DQS<0:3> signals are active). The UNSDATA<0:7> may be provided to a data descrambler, such as the data descrambler 116 of FIG. 1.

Figure 3:
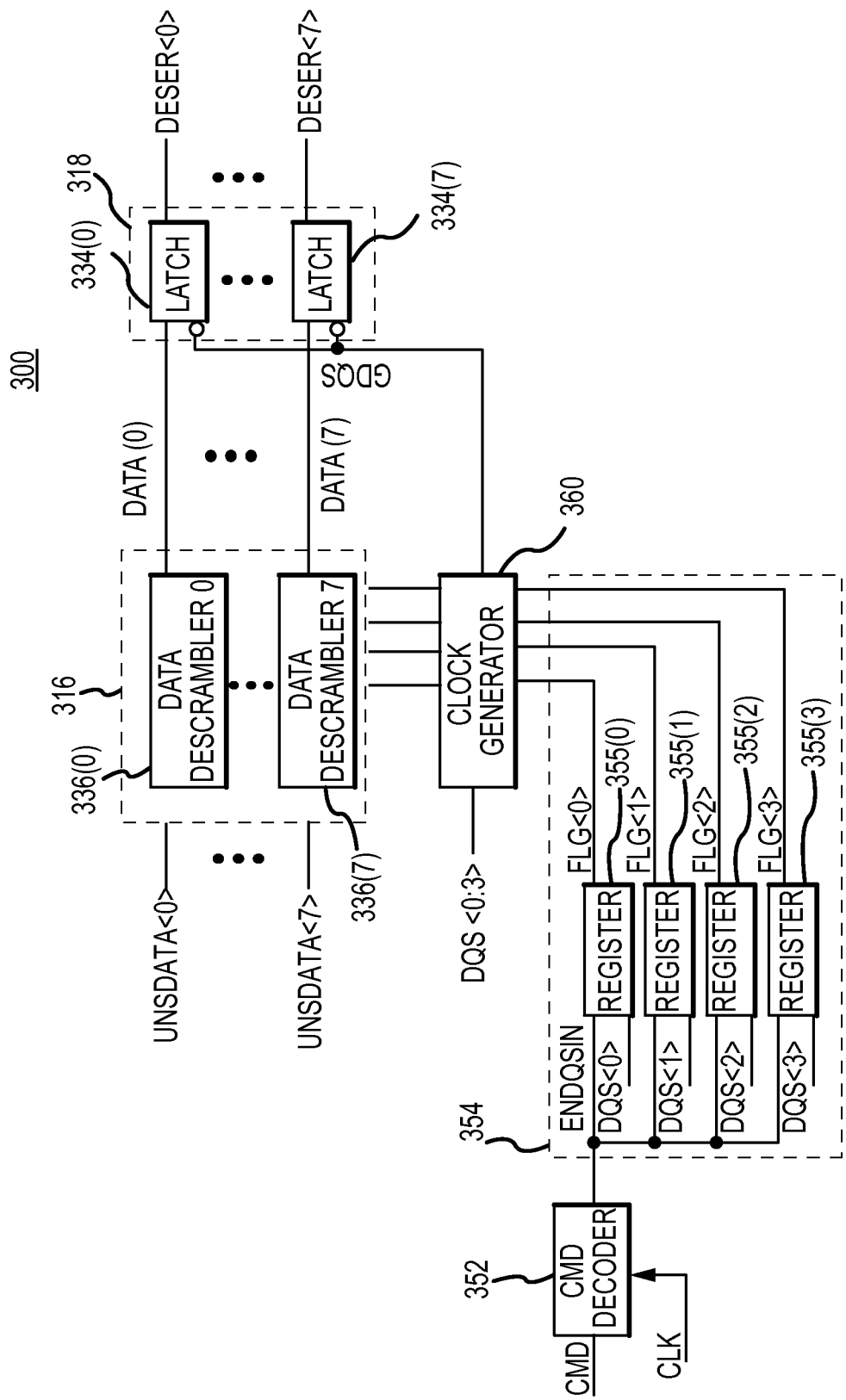
FIG. 3 is a block diagram of an apparatus including circuitry configured to sort data using a divided clock according to an embodiment of the disclosure.

FIG. 3 is a block diagram of an apparatus 300 including circuitry configured to sort data using a divided clock according to an embodiment of the disclosure. The apparatus 300 may include a command decoder 352 coupled to a flag circuit 354. The flag circuit 354 may be coupled to a data descrambler 316, a clock generator 360, and a hold register 318. The command decoder 352 may be implemented in the command decoder 152 of FIG. 1, the flag circuit 354 may be implemented in the flag circuit 154 of FIG. 1, the data descrambler 316 may be implemented in the data descrambler 116 of FIG. 1, the clock generator 360 may be implemented in the clock generator 160 of FIG. 1, and/or the hold register 318 may be implemented in the hold register 118 of FIG. 1.

The command decoder 352 may receive the CMD signal and the CLK signal. The command decoder 352 may provide a pulse on the ENDQSIN signal based on timing of receipt of a command via the CMD signal and based on the CWL. The flag circuit 354 may include registers 355(0-3). The registers 355(0-3) may each have an input coupled to the ENDQSIN signal, and may be clocked responsive to a respective DQS<0:3> signal. Thus, each of the registers 355(0-3) may provide a respective FLG<0:3> signal having a value of the ENDQSIN signal at an output responsive to the respective DQS<0:3> signal.

The data descrambler 316 may include data descramblers 336(0-7). The data descramblers 336(0-7) may be configured to sort the UNSDATA<0:7> to provide the sorted DATA<0:7> and provide each bit of the sorted DATA<0:7> to a respective latch of latches 334(0-7) of the hold register 318. The sorting of the UNSDATA<0:7> may be based on the FLG<0:3> signals. The FLG<0:3> signals may indicate a location of the first bit of data associated with a write command as received at a DQ within the UNSDATA<0:7>. In some examples, the data descramblers 336(0-7) may include multiplexers controlled by the FLG<0:3> signals. The data descramblers 336(0-7) may provide the sorted DATA<0:7> to the latches 334(0-7) of the hold register 318.

The clock generator 360 may generate a GDQS signal having a pulse based on the FLG<0:3> signal and the DQS<0:3> signals. Each of the latches 334(0-7) may be clocked by the GDQS signal to provide a respective bit of the sorted DATA<0:7> at an output (e.g., the DESER<0:7> data). The DESER<0:7> data may be provided to downstream circuitry.

In operation, the command decoder 352 receives a command via the CMD signal. When the command is a write command, corresponding write data may also be received. The write data may be stored in registers in an unsorted fashion. The unsorted data may be received at the data descrambler 316 via the UNSDATA<0:7> signals. The command decoder 352 may provide a 1 tCK pulse on ENDQSIN signal at a time based on a CWL determined from receipt of the command. Based on a timing relationship between the pulse on the ENDQSIN signal and the pulses on the DQS<0:3> signals, the flag circuit 354 may assert one of the FLG<0:3> signals to indicate a location of the first bit of data associated with the command within the UNSDATA<0:7> signals. Pairs of the UNSDATA<0:7> bits may be clocked based on a respective DQS<0:3> signal (e.g., UNSDATA<0:1> may be clocked based on DQS<O> signal, UNSDATA<2:3> may be clocked based on DQS<1> signal, etc.). Timing of the pulse of the ENDQSIN signal may be coincident with the first bit of data (e.g., CWL). Thus, the DQS<0:3> signal having a rising edge that is enveloped by (e.g., overlaps with) the pulse of the ENDQSIN signal may indicate a location of the first bit of data associated with the command within the UNSDATA<0:7>, and the FLG<0:3> signal associated with that particular DQS<0:3> signal may be asserted. The asserted one of the FLG<0:3> signals may be used to sort the UNSDATA<0:7>.

The data descramblers 336(0-7) may sort the UNSDATA<0:7> based on the asserted FLG<0:3> signal to provide the DATA<0:7>. For example, the data descrambler 336(0) may route one of the UNSDATA<0:7> that includes the first bit of data associated with the command to DATA(0) based on the FLG<0:3> signals, the data descrambler 336(1) may route one of the UNSDATA<0:7> that includes the second bit of data associated with the command to DATA(1) based on the FLG<0:3> signals, etc. The data descramblers 336(0-7) may each hold a respective bit of the DATA<0:7> at an output in parallel.

Responsive to the GDQS signal, each of the latches 334(0-7) may latch a respective bit of the DATA<0:7> at an output in parallel to provide the DESER <0:7> data. The GDQS signal may be provided by the clock generator 360. The clock generator 360 may generate the GDQS signal based on the asserted FLG<0:3> signal and the DQS<0:3> signals. Because the asserted FLG<0:3> is indicative an order of the sorted DATA<0:7> based on the DQS<0:3> signals, the DQS<0:3> signal that corresponds to the last bit of the sorted DATA<0:7> may also be determined. Thus, the clock generator 360 may provide a 1 tCK pulse on the GDQS signal that is based on the DQS<0:3> signal associated with last bit of data.

It will be appreciated that while the apparatus 300 depicts circuitry associated with sorting 8 bits of data, more circuitry (e.g., registers of the flag circuit 354, data descramblers of the data descrambler 316, latches of the hold register 318) may be added to sort more than 8 bits of data, or less circuitry may be included when less than 8 bits of data are to be sorted.

Figure 4:
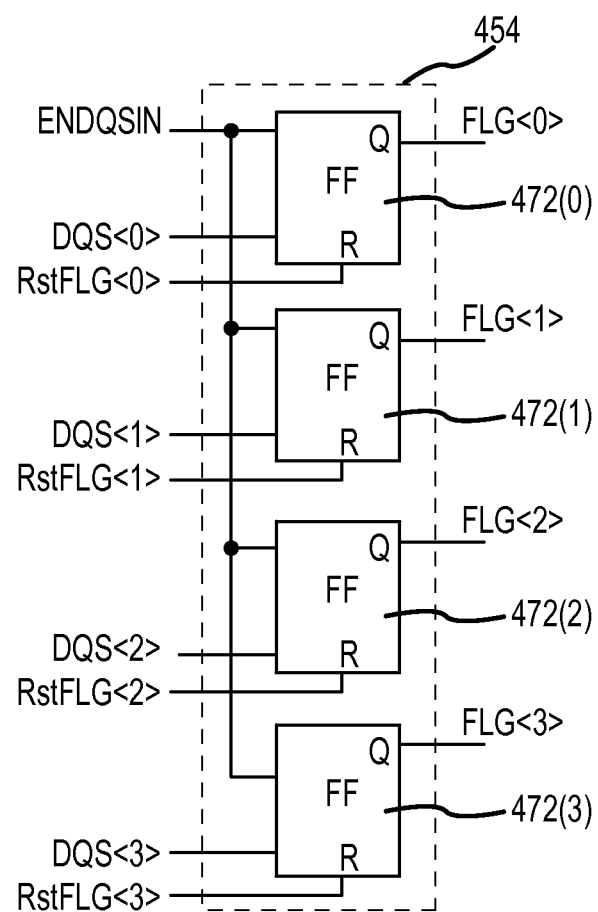
FIG. 4 is a block diagram of an apparatus including a flag circuit according to an embodiment of the disclosure.

FIG. 4 is a block diagram of an apparatus 400 including a flag circuit 454 according to an embodiment of the disclosure. The flag circuit 454 may be implemented in the flag circuit 154 of FIG. 1 and/or the flag circuit 354 of FIG. 3. The flag circuit 454 may include flip-flops 472(0-3) that are each configured to receive the ENDQSIN signal at an input and to provide a respective FLG<0:3> signal at an output responsive to a respective DQS<0:3> signal. The FLG<0:3> signals may be provided to a data descrambler, such as the data descrambler 116 of FIG. 1 or the data descrambler 316 of FIG. 3, to sort unsorted data. The FLG<0:3> signals may be provided to a clock generator, such as the clock generator 160 of FIG. 1 or the clock generator 360 of FIG. 3, to generate a GDQS signal.

In operation, the ENDQSIN signal may have a 1 tCK pulse that is indicative of timing of receipt of data associated with a command. The flag circuit 454 may assert one of the FLG<0:3> signals indicating a location of a first bit of the data within unsorted data using the flip-flops 472(0-3). For example, one of the flip-flops 472(0-3) may assert one of the FLG<0:3> signals based on pulse of the ENDQSIN signal sampled by the rising edge of a respective one of the DQS<0:3> signals. The flip-flops 472(0-3) may also receive a respective reset signal RSTFLG<0:3> to reset the FLG<0:3> signals for the non-asserted FLG<0:3> signals. It will be appreciated that more or less than four flip flops may be included in the flag circuit 454.

Figure 5:
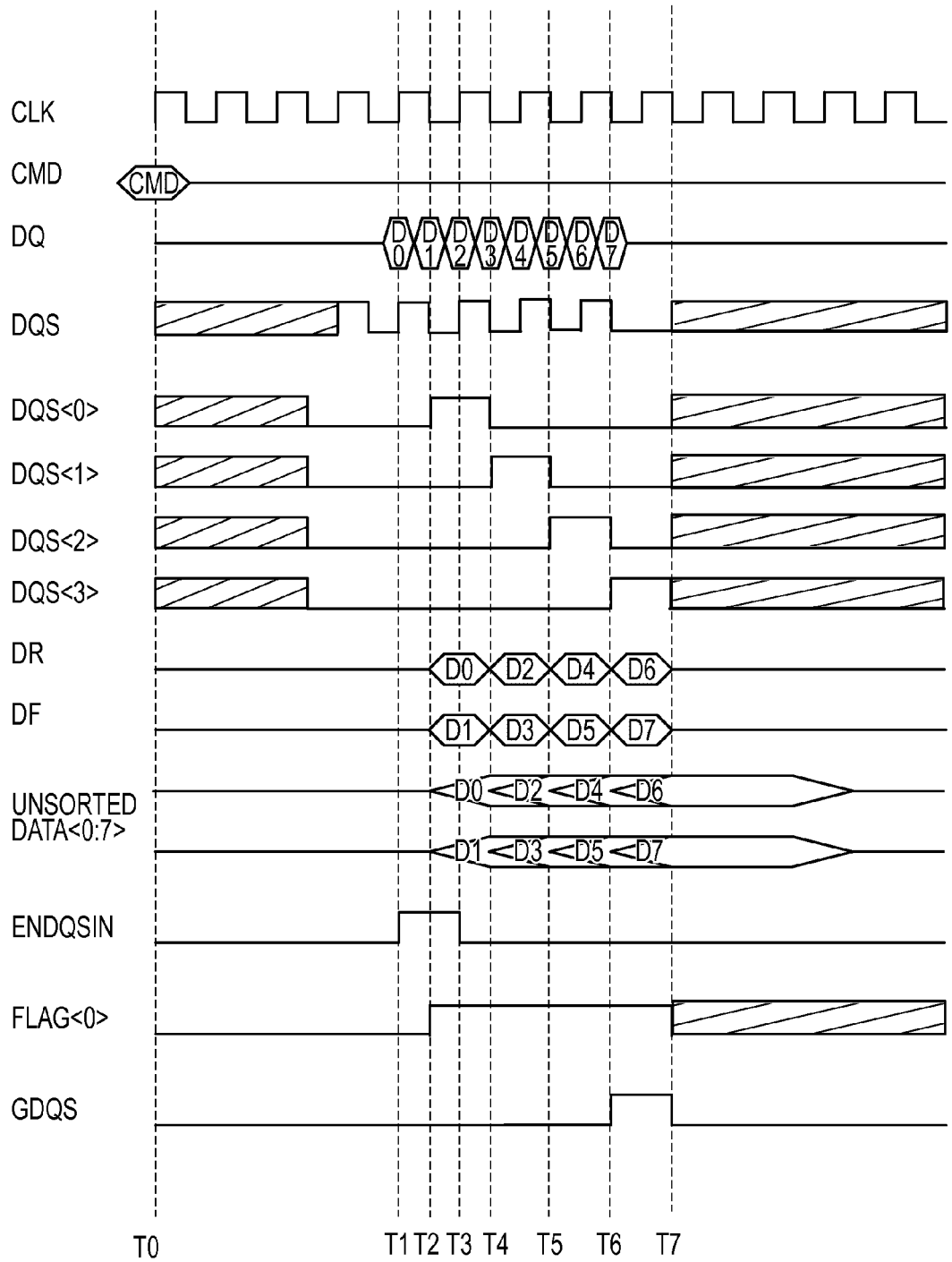
FIG. 5 is a timing diagram of various signals during capture of data using a divided clock during a memory access operation according to an embodiment of the disclosure.

FIG. 5 is an exemplary timing diagram depicting various signals propagating through circuitry of the apparatus 100 of FIG. 1, the circuitry of the apparatus of 200 of FIG. 2, the circuitry of the apparatus of FIG. 3, and/or the circuitry of the apparatus of FIG. 4. The CLK signal may represent a CLK signal received at the command decoder 152 of FIG. 1 and/or the command decoder 352 of FIG. 3. The CMD signal may represent the CMD signal received at received at the command decoder 152 of FIG. 1 and/or the command decoder 352 of FIG. 3. The DQ may represent the DQ providing the data to the setup and hold circuit 112 of FIG. 1 and/or the setup and hold circuit 212 of FIG. 2. The DQS signal may represent the DQS signal received at the setup and hold circuit 112 of FIG. 1 and/or the setup and hold circuit 212 of FIG. 2. The DQS<0:3> signals may represent the DQS<0:3> signals of FIGS. 1-4. The DR and DF signals may represent the DR and DF signals of FIGS. 1 and 2. The UNSORTED DATA <0:7> may represent the UNSDATA<0:7> of FIGS. 1-3. The ENDQSIN signal may represent the ENDQSIN signal of FIGS. 1, 3, and 4. The FLG<O> signal may represent the FLG<O> signals of FIGS. 1, 3, and 4. The GDQS signal may represent the GDQS signals of FIGS. 1 and 3.

At time T0, a command may be received via the CMD signal coincident with a rising edge of the CLK signal. Between times T0 and T1, the DQS signal may start with a preamble of at least 1.5 tCK prior to receiving a first bit of data via the DQ. At time T1, a first bit of data D0 may be received coincident with a rising edge of the DQS signal at a setup and hold circuit (e.g., the setup and hold circuit 112 of FIG. 1 and/or the setup and hold circuit 212 of FIG. 2), and each subsequent bit D1-D7 may be received coincident with each transition of the DQS signal. Upon receipt of the DQS signal, a clock divider may generate the DQS<0:3> signals having 4 tCK periods and staggered 1 tCK pulses during each respective period. As an example, the DQS<O> signal may have a pulse 1 tCK between times T2 and T4, the DQS<1> signal may have a pulse 1 tCK between times T4 and T5, the DQS<2> signal may have a pulse 1 tCK between times T5 and T6, and the DQS<3> signal may have a pulse 1 tCK between times T6 and T7.

At time T2, the setup and hold circuit may provide the D0 and D1 data bits via the DR and DF signals, respectively, for 1 tCK. At time T2, the D0 and D1 data bits may be latched at respective registers of a deserialize circuit coincident with a rising edge of the DQS<0> signal to provide UNSORTED DATA D0 and D1, respectively. Following the D0 and D1 data bits, the DR and DF signals may provide the D2 and D3 data bits, respectively, for 1 tCK. At time T4, the D2 and D3 data bits may be latched at respective registers of a deserialize circuit coincident with a rising edge of the DQS<1> signal to provide UNSORTED DATA <2> and <3>, respectively.

Following the D2 and D3 data bits, the DR and DF signals may provide the D4 and D5 data bits, respectively, for 1 tCK. At time T5, the D4 and D5 data bits may be latched at respective registers of a deserialize circuit coincident with a rising edge of the DQS<2> signal to provide UNSORTED DATA <4> and <5>, respectively. Following the D4 and D5 data bits, the DR and DF signals may provide the D6 and D7 data bits, respectively, for 1 tCK. At time T6, the D6 and D7 data bits may be latched at respective registers of a deserialize circuit coincident with a rising edge of the DQS<3> signal to provide UNSORTED DATA <6> and <7>, respectively. The latched UNSORTED DATA <0:7> bits may each be held for the 4 tCK period of the associated DQS<0:3> signal.

In the timing diagram 500, the preamble length of the DQS signal is 1.5 tCK, resulting in the DQS<0> signal latching the D0 and D1 data bits as the UNSORTED DATA D0 and D1. The DQS<0:3> signals may be generated based on a start of the preamble of the DQS signal, and in some memory systems, the length of the preamble of the DQS signal may be any length greater than or equal to the 1.5 tCK. Thus, in these types of systems, when the preamble of the DQS signal is greater than 1.5 tCK, another of the DQS<1:3> signals may latch the D0 and D1 data bits into respective locations of the UNSORTED DATA D2-D7. Therefore, the DQS signal may not provide a deterministic method for determining which edge of the DQS signal corresponds to the first bit of data. In these examples, a determination of when the D1 data bit is received at the DQ may be based on a CWL determined from time of receipt of the CMD. Because the CMD signal is received and clocked according to the CLK signal, the determination of time of receipt of the D1 data may be based on the CLK signal. However, the data D0-D7 are clocked according to the DQS signal, which may have timing differences of up to +/−¼ of a tCK relative to timing of the CLK signal. To mitigate the potential timing differences, the ENDQSIN signal may be provided with a 1 tCK pulse at a time that coincides with receipt of the D0 data at the DQ, e.g., starting at a time T1 and ending at a time T3. The ENDQSIN signal pulse may be used to indicate which of the DQS<0:3> signals latched the D0 data by asserting the FLG<O> signal responsive to a rising edge of the DQS<O> signal at time T2. By starting the pulse according to the D1 data, the pulse may provide a +/−½ tCK overlap with a rising edge of one of the DQS<0> signal to mitigate against a potential timing variance of +/−¼tCK between the CLK and DQS signals. The FLG<0> signal may be set by a flag circuit, such as the flag circuit 154 of FIG. 1, the flag circuit 354 of FIG. 3, and/or the flag circuit 454 of FIG. 4. After time T7, the FLG<0> signal may reset responsive to a falling edge of the DQS<0> signal.

A data descrambler, such as the data descrambler 116 of FIG. 1 and/or the data descrambler 316 of FIG. 3, may sort the UNSORTED DATA D0-D7 based on the FLG<0> signal. Further, a clock generator may generate a 1 tCK pulse on a GDQS signal that coincides with a pulse on the DQS<0:3> signal associated with latching the last two bits of the data D6 and D7 (e.g., DQS<3> starting at time T6 and ending at time T7, in this example). A set of latches each configured to receive a respective bit of the sorted data in parallel may latch the sorted data at an output responsive to the pulse of the GDQS signal.

The timing diagram 500 is exemplary, and actual relative timing relationships between signals may vary from the relationships depicted. Further, the length of pulses of signals of the timing diagram 500 may vary from depicted, and the number of data bits to be captured may be greater or less than 8.

Figure 6:
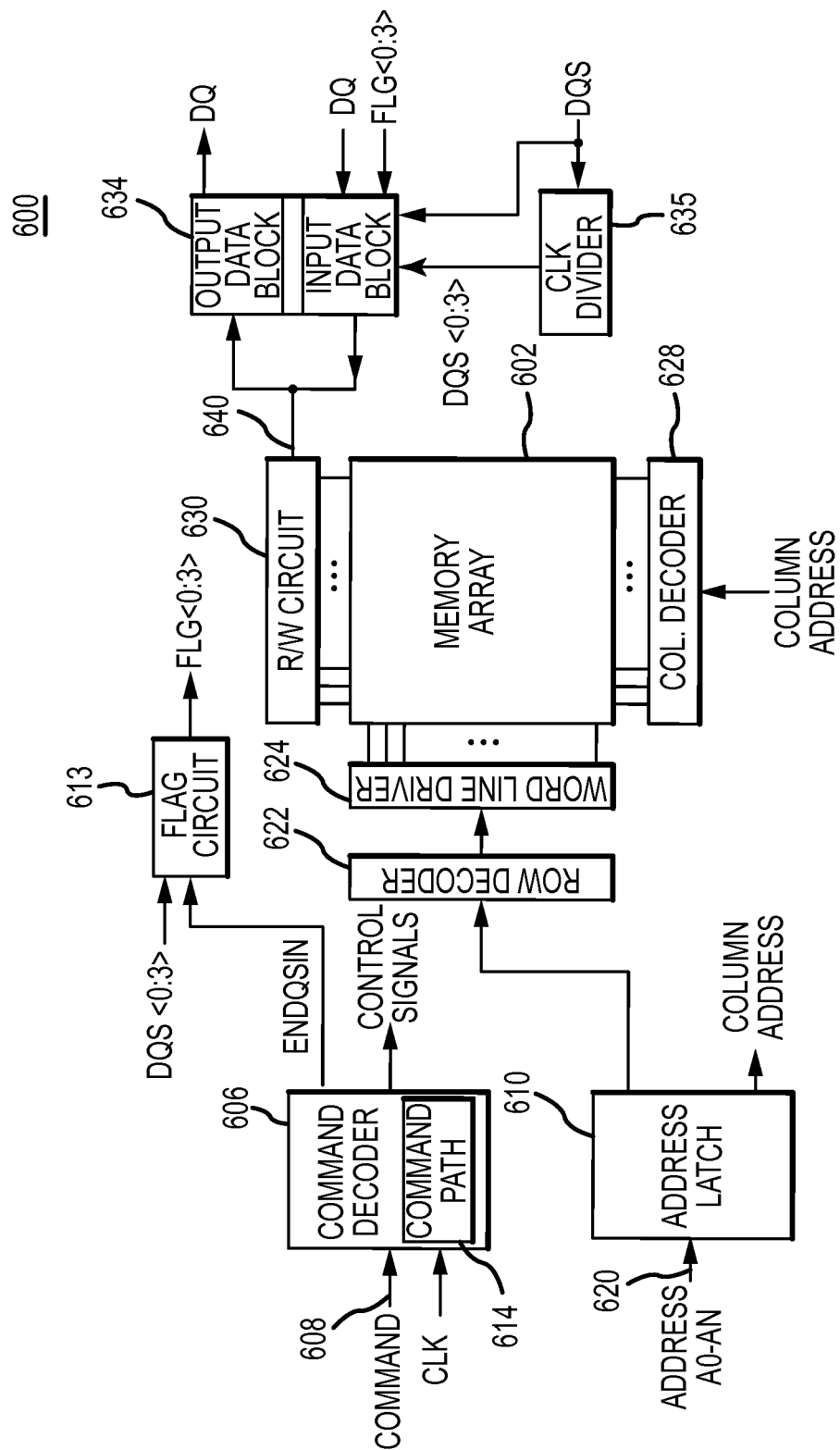
FIG. 6 is a block diagram of a memory according to an embodiment of the disclosure.

FIG. 6 illustrates a portion of a memory 600 according to an embodiment of the present disclosure. The memory 600 includes an array 602 of memory cells, which may be, for example, volatile memory cells (e.g., DRAM memory cells, SRAM memory cells), non-volatile memory cells (e.g., flash memory cells), or some other types of memory cells. The memory 600 includes a command decoder 606 that receives memory commands through a command bus 608 and provides (e.g., generates) corresponding control signals within the memory 600 to carry out various memory operations. The command decoder 606 may also provide an ENDQSIN signal having a pulse that is based on timing of receipt of the command signal. The command decoder 606 may include the command decoder 152 of FIG. 1, the command decoder 352 of FIG. 3, or combinations thereof. Row and column address signals are provided (e.g., applied) to the memory 600 through an address bus 620 and provided to an address latch 610. The address latch then outputs a separate column address and a separate row address.

The row and column addresses are provided by the address latch 610 to a row address decoder 622 and a column address decoder 628, respectively. The column address decoder 628 selects bit lines extending through the array 602 corresponding to respective column addresses. The row address decoder 622 is connected to word line driver 624 that activates respective rows of memory cells in the array 602 corresponding to received row addresses. The selected data line (e.g., a bit line or bit lines) corresponding to a received column address are coupled to a read/write circuitry 630 to provide read data to an input/output data block 634 via an input-output data bus 640. Write data are provided to the memory array 602 through the I/O data block 634 and the memory array read/write circuitry 630. The I/O block 634 may be coupled to a flag circuit 613 and a clock divider 635. The clock divider may provide DQS<0:3> signals based on a DQS signal. The flag circuit 613 may provide FLG<0:3> signals based on the DQS<0:3> signals and the ENDQSIN signal. The I/O data block 634 may include clocked circuitry that operate responsive to the DQS, FLG<0:3> and DQS<0:3> signals, for example. The flag circuit 613 may include the flag circuit 154 of FIG. 1, the flag circuit 354 of FIG. 3, the apparatus 400 of FIG. 4, or combinations thereof. The clock divider may include the clock divider 120 of FIG. 1. The input block may include any portion of the data capture circuit 110 of FIG. 1, any portion of the command circuit 150 of FIG. 1, any portion of the apparatus 200 of FIG. 2, any portion of the apparatus 300 of FIG. 3, or combinations thereof.

The command decoder 606 responds to memory commands provided to the command bus 608 to perform various operations on the memory array 602. In particular, the command decoder 606 is used to provide internal control signals to read data from and write data to the memory array 602.

From the foregoing it will be appreciated that, although specific embodiments of the disclosure have been described herein for purposes of illustration, various modifications may be made without deviating from the spirit and scope of the disclosure. Accordingly, the disclosure is not limited except as by the appended claims.

What is claimed is:

1. An apparatus, comprising:
  a clock divider configured to receive a data strobe signal, the clock divider configured to provide a plurality of divided clock signals, wherein a divided clock signal of the plurality of divided clock signals has a frequency that is less than a frequency of the data strobe signal;
  a command circuit configured to receive a command, the command circuit configured to assert one of a plurality of flag signals based on the plurality of divided clock signals and based on a defined latency from a time of receipt of the command; and
  a data capture circuit configured to serially receive data associated with the command and to provide deserialized data responsive to the plurality of divided clock signals, wherein the data capture circuit is further configured to sort the deserialized data based on the asserted one of the plurality of flag signals to provide sorted data, wherein the data capture circuit includes a setup and hold circuit configured to capture data received responsive to edges of the data strobe signal, wherein the setup and hold circuit is further configured to provide a rising edge data signal having a value based on data captured responsive to rising edges of the data strobe signal to a first output in parallel with provision of a falling edge data signal having a value based on data captured responsive to falling edges of the data strobe signal to a second output, the setup and hold circuit comprises:
  a first register configured to capture the rising edge data responsive to the rising edges of the data strobe signal;
  a latch configured to provide the rising edge data to the first output responsive to the falling edges of the data strobe signal; and
  a second register configured to capture and provide the falling edge data to the second output responsive to the falling edges of the data strobe signal.

2. The apparatus of claim 1, wherein the data capture circuit further comprises a deserialize circuit configured to deserialize data responsive to the plurality of divided clock signals.

3. The apparatus of claim 2, wherein the deserialize circuit comprises:
  a first plurality of registers configured to receive a rising edge data signal, the rising edge data signal providing data captured responsive to rising edges of the data strobe signal, wherein each of the first plurality of registers is configured to provide a value of the rising edge data signal at an output responsive to a cycle of a respective one of the plurality of divided clock signals; and
  a second plurality of registers configured to receive a falling edge data signal, the falling edge signal providing data captured responsive to falling edges of the data strobe signal, wherein each of the second plurality of registers is configured provide a value of the rising edge data signal at an output responsive to a cycle of a respective one of the plurality of divided clock signals.

4. The apparatus of claim 1, wherein the data capture circuit further comprises data descrambler configured to sort the deserialized data based on the asserted one of the plurality of flag signals.

5. The apparatus of claim 4, wherein the data descrambler comprises a plurality of descramblers, wherein a descrambler is configured to select a bit of the deserialized data to provide at an output based on the asserted one of the plurality of flag signals.

6. An apparatus, comprising:
  a clock divider configured to receive a data strobe signal, the clock divider configured to provide a plurality of divided clock signals, wherein a divided clock signal of the plurality of divided clock signals has a frequency that is less than a frequency of the data strobe signal;
  a command circuit configured to receive a command, the command circuit configured to assert one of a plurality of flag signals based on the plurality of divided clock signals and based on a defined latency from a time of receipt of the command; and
  a data capture circuit configured to serially receive data associated with the command and to provide deserialized data responsive to the plurality of divided clock signals, wherein the data capture circuit is further configured to sort the deserialized data based on the asserted one of the plurality of flag signals to provide sorted data, and wherein the data capture circuit includes a data descrambler configured to sort the deserialized data based on the asserted one of the plurality of flag signals, the data descrambler comprises a plurality of descramblers, wherein a descrambler is configured to select a bit of the deserialized data to provide at an output based on the asserted one of the plurality of flag signals and the descrambler includes a multiplexer configured to receive each bit of the deserialized data and to provide the selected bit to an output responsive to the asserted one of the plurality of flag signals.

7. An apparatus, comprising:
  a clock divider configured to receive a data strobe signal, the clock divider configured to provide a plurality of divided clock signals, wherein a divided clock signal of the plurality of divided clock signals has a frequency that is less than a frequency of the data strobe signal:
a command circuit configured to receive a command, the command circuit configured to assert one of a plurality of flag signals based on the plurality of divided clock signals and based on a defined latency from a time of receipt of the command; and
a data capture circuit configured to serially receive data associated with the command and to provide deserialized data responsive to the plurality of divided clock signals, wherein the data capture circuit is further configured to sort the deserialized data based on the asserted one of the plurality of flag signals to provide sorted data, and wherein the data capture circuit includes a hold register configured to latch the sorted data at an output responsive to a global clock signal.

8. The apparatus of claim 7, wherein the hold register comprises a plurality of latches, wherein a latch of the plurality of latches is configured to latch a bit of the sorted data at an output responsive to the global clock signal.

9. The apparatus of claim 7, wherein the command circuit comprises a clock generator configured to generate the global clock signal having a pulse based on the asserted one of the flag signals.

10. An apparatus, comprising:
a clock divider configured to provide a plurality of divided clock signals based on a data strobe signal, wherein a first divided clock signal of the plurality of divided clock signals includes a pulse that has a unique phase as compared with a pulse included in a second divided clock signal of the plurality of divided clock signals; and
a data capture circuit configured to deserialize data responsive to the plurality of divided clock signals, wherein the data capture circuit is configured to latch a first pair of bits responsive to the pulse of the first divided clock signal and to latch a second pair of bit responsive to the pulse of the second divided clock signal, wherein the data capture circuit comprises a data descrambler configured to sort the first pair of data bits and the second pair of data bits based on a chronological order of receipt of the first pair of data bits and the second pair of data bits at the data capture circuit.

11. An apparatus, comprising:
a clock divider configured to provide a plurality of divided clock signals based on a data strobe signal, wherein a first divided clock signal of the plurality of divided clock signals includes a pulse that has a unique phase as compared with a pulse included in a second divided clock signal of the plurality of divided clock signals;
a data capture circuit configured to deserialize data responsive to the plurality of divided clock signals, wherein the data capture circuit is configured to latch a first pair of bits responsive to the pulse of the first divided clock signal and to latch a second pair of bit responsive to the pulse of the second divided clock signal; and
a command circuit configured to assert a flag signal based on a write latency from receipt of a command and based on the pulse of the first divided clock signal or the pulse of the second divided clock signal, wherein, responsive to the flag signal being asserted based on the pulse of the second clock signal, the second pair of data bits are placed in a first two positions and the first pair of data bits are placed in a subsequent two positions.

12. The apparatus of claim 11, wherein the command circuit comprises a command decoder configured to receive and decode a command, wherein the command decoder is configured provide a control signal having a pulse at a time based on a write latency determined from a time of receipt of the command.

13. The apparatus of claim 12, wherein the command circuit comprises a flag circuit configured to assert the flag signal based on the pulse of the control signal and the pulse of the first divided clock signal or the pulse of the second divided clock signal.

14. The apparatus of claim 13, wherein the flag circuit comprises:
a first register configured to receive the control signal at an input and is clocked responsive to the pulse of the first divided clock signal, the first register configured to assert a first flag signal responsive to the pulse of control signal being present at the input while the first register is being clocked by the first divided clock signal; and
a second register configured to receive the control signal at an input and is clocked responsive to the pulse of the second divided clock signal, the second register configured to assert a second flag signal responsive to the pulse of control signal being present at the input while the second register is being clocked by the second divided clock signal, wherein the asserted flag signal is one of the first flag signal or the second flag signal.

15. The apparatus of claim 14, wherein the first register includes a first flip-flop configured to propagate a value of the control signal to an output responsive to the pulse of the first divided clock signal, and wherein the second register includes a second flip-flop configured to propagate the value of the control signal to an output responsive to the pulse of the second divided clock signal.

16. A method, comprising:
serially receiving data at a memory responsive to a data strobe signal;
receiving a command associated with the serially received data,
dividing a frequency of the data strobe signal to generate a plurality of divided clock signals having staggered periods relative to one another;
providing a control signal having a pulse, wherein timing of the pulse is based on a defined latency from a time of reception of the command, wherein a respective one of the plurality of divided clock signals includes a rising edge that is enveloped by the pulse of the control signal, and
deserializing the serially received data responsive to the plurality of divided clock signals to provide deserialized data.

17. The method of claim 16, further comprising:
asserting a flag signal responsive to a respective one of the plurality of divided clock signals, wherein the asserted flag signal is indicative of a location of a first bit of the serially received data within the deserialized data; and
sorting the deserialized data based on the asserted flag signal.

18. The method of claim 16, wherein deserializing the serially received data comprises providing a rising edge data bit of the serially received data in parallel with a falling edge data bit of the serially received data to a data deserializer.

19. The method of claim 18, further comprising:
latching the rising edge data bit at a first output responsive to one of the plurality of divided clock signals; and latching the falling edge data bit at a second output responsive to the one of the plurality of divided clock signals.

20. A method, comprising:
responsive to a clock signal, receiving a command at a memory;
responsive to a data strobe signal, receiving a plurality of bits of data associated with the command;
providing a control signal having a pulse, wherein timing of the pulse is based on a write latency from receipt of the command,
deserializing the plurality of bits based on a plurality of divided clock signals, wherein the plurality of data strobe signals are generated from the data strobe signal;
responsive to one of the plurality of divided clock signals, asserting one of a plurality of flag signals based on the pulse of the control signal; and
sorting the deserialized plurality of bits based on the asserted one of the plurality of flag signals.

21. The method of claim 20, wherein a divided clock signal of the plurality of divided clock signals that includes a unique phase as compared to remaining divided clock signals of the plurality of data strobe signals.

22. The method of claim 20, further comprising propagating the control signal along a path having a same length as a path along which the divided clock signal is propagated.

23. The method of claim 20, further comprising applying a delay equal to the write latency prior to providing the pulse on the control signal.

* * * * *